(12) United States Patent
Varadarajan

(10) Patent No.: US 10,025,359 B2
(45) Date of Patent: Jul. 17, 2018

(54) METAL FOAM HEAT EXCHANGERS FOR DISPERSING EXHAUST FLOW

(71) Applicant: Intel Corporation, Santa Clara, CA (US)

(72) Inventor: Krishnakumar Varadarajan, Bangalore (IN)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 15/279,913

(22) Filed: Sep. 29, 2016

(65) Prior Publication Data
US 2018/0088636 A1 Mar. 29, 2018

(51) Int. Cl.
| | |
|---|---|
| *G06F 1/16* | (2006.01) |
| *G06F 1/20* | (2006.01) |
| *F28F 13/00* | (2006.01) |
| *F28F 21/08* | (2006.01) |
| *H05K 7/20* | (2006.01) |

(52) U.S. Cl.
CPC ............ *G06F 1/203* (2013.01); *F28F 13/003* (2013.01); *F28F 21/081* (2013.01); *G06F 1/163* (2013.01); *H05K 7/20154* (2013.01); *H05K 7/20436* (2013.01)

(58) Field of Classification Search
CPC ..... G06F 1/203; G06F 1/163; H05K 7/20154; H05K 7/20436; F28F 21/081; F28F 13/003
USPC .................................................... 361/679.46
See application file for complete search history.

(56) References Cited

U.S. PATENT DOCUMENTS

| | | | | |
|---|---|---|---|---|
| 7,225,862 B2* | 6/2007 | Chin | ...................... | F24F 1/0059 165/122 |
| 7,312,985 B2* | 12/2007 | Lee | ........................ | G06F 1/203 165/122 |
| 7,492,588 B2* | 2/2009 | Hwang | .............. | H05K 7/20154 165/121 |
| 7,987,898 B2* | 8/2011 | Meng | .................... | F04D 29/582 165/104.34 |
| 8,081,459 B2* | 12/2011 | Doll | ................... | H05K 7/20736 361/679.47 |
| 2013/0087180 A1* | 4/2013 | Stark | ....................... | H01L 35/30 136/205 |

(Continued)

FOREIGN PATENT DOCUMENTS

EP      0559092 A1 *   9/1993   ............ F28F 13/003

*Primary Examiner* — Tuan T Dinh
*Assistant Examiner* — Rockshana Chowdhury
(74) *Attorney, Agent, or Firm* — Hanley, Flight & Zimmerman, LLC

(57) ABSTRACT

Apparatus and methods including metal foam heat exchangers for dispersing exhaust flow are disclosed. A wearable device includes a housing having a form factor sized to be worn by a human. The housing has an exhaust port. The wearable device further includes a heat generating device carried within the housing. The heat generating device is to generate heat in operation. The wearable device further includes a metal foam heat exchanger disposed within the housing adjacent the exhaust port. The metal foam heat exchanger is to receive heat generated by the heat generating device. The metal foam heat exchanger defines multiple flow paths within the housing to disperse exhaust in multiple directions to reduce a flow velocity of the exhaust exiting the exhaust port.

22 Claims, 9 Drawing Sheets

(56) References Cited

U.S. PATENT DOCUMENTS

2014/0064541 A1\* 3/2014 Guenther ............... H04R 1/288
  381/351
2014/0145107 A1\* 5/2014 Bromberg ................ C01B 3/22
  252/71

\* cited by examiner

US 10,025,359 B2

METAL FOAM HEAT EXCHANGERS FOR DISPERSING EXHAUST FLOW

FIELD OF THE DISCLOSURE

This disclosure relates generally to heat exchangers, and, more particularly, to metal foam heat exchangers for dispersing exhaust flow.

BACKGROUND

Heat exchangers are configured to exchange and/or transfer heat from one medium to another. Parallel plate heat exchangers are commonly implemented in electronic devices to assist in dissipating and/or exhausting heat generated by one or more electronic component(s) (e.g., a processor, a central processing unit (CPU) and/or a graphics processing unit (GPU)) of the electronic device. Conventional parallel plate heat exchangers are configured such that a flow of a fluid (e.g., an airflow) enters and exits channels and/or gaps formed between the plates of the parallel plate heat exchanger in a single direction defined by the orientation of the plates. In some instances, the exhaust flow from an electronic device incorporating a parallel plate heat exchanger has an undesirably high flow velocity. For example, a relatively high exhaust flow velocity may create discomfort for a user that is exposed to the exhaust flow while wearing the electronic device or while positioned near the device.

Figure 1:
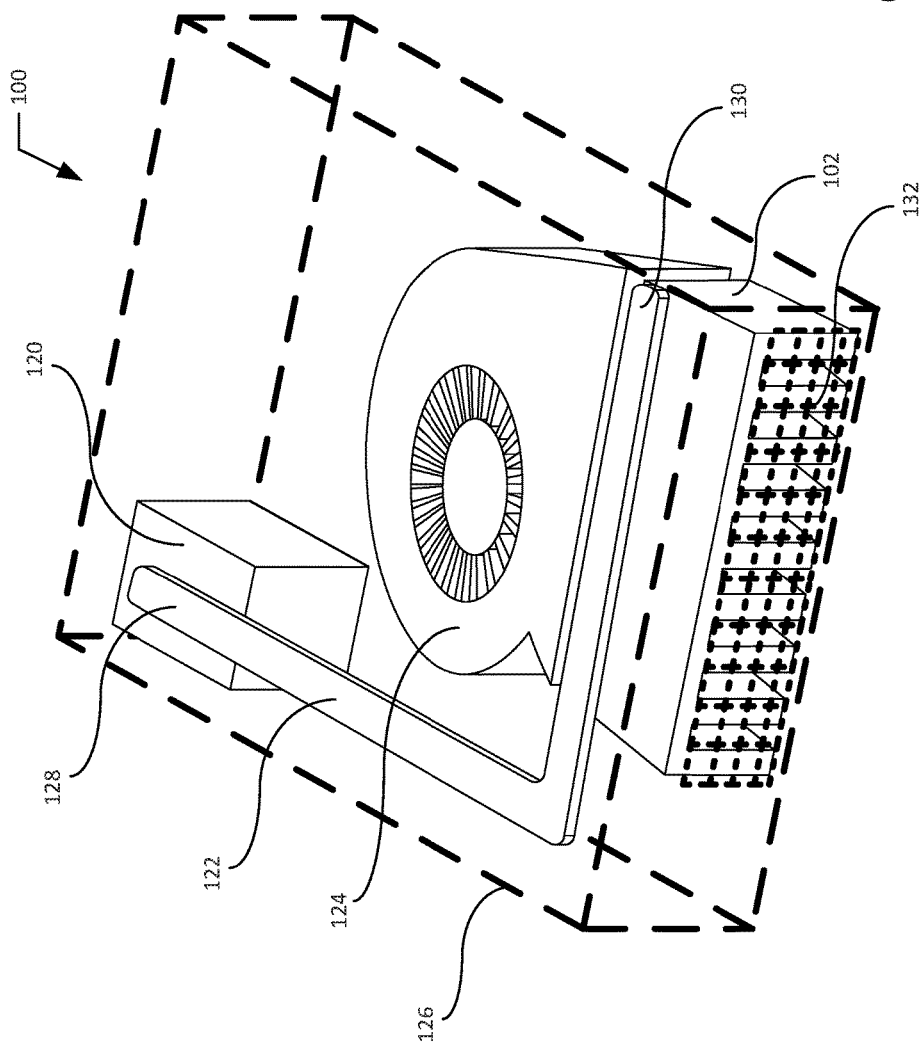
FIG. 1 is a perspective view of a prior art electronic device including a parallel plate heat exchanger.

Certain examples are shown in the above-identified figures and described in detail below. In describing these examples, like or identical reference numbers are used to identify the same or similar elements. The figures are not necessarily to scale and certain features and certain views of the figures may be shown exaggerated in scale or in schematic for clarity and/or conciseness.

DETAILED DESCRIPTION

Conventional parallel plate heat exchangers are configured such that a flow of a fluid (e.g., an airflow) enters and exits channels and/or gaps formed between the plates of the parallel plate heat exchanger in a single direction defined by the orientation of the plates. In many instances, the exhaust flow from an electronic device incorporating a parallel plate heat exchanger has an undesirably high flow velocity. For example, a high exhaust flow velocity may create discomfort for a user when the electronic device is a wearable device. As used herein, the term "wearable device" refers to an article of clothing (e.g., a shirt, a vest, shoes, etc.) and/or an accessory (e.g., a smartwatch, a fitness band, a headset, etc.) incorporating computer and/or electronic technologies and/or components, where the article of clothing and/or accessory is to be worn by a human. As used herein, the term "body contact surface" refers to a surface of a wearable device that is configured to contact and/or face toward a body of a human when the wearable device is worn by the human.

Dispersing an exhaust flow of a parallel plate heat exchanger requires that the exhaust flow be ducted and/or diverted through one or more additional channels (e.g., channels in addition to those formed by the parallel plates of the heat exchanger) that are configured to direct the exhaust flow in different directions. In many instances, however, the presence of such additional channels causes undesirable pressure drops in the exhaust flow as a result of the size of the additional channels relative to the size of the channels formed by the parallel plates of the heat exchanger. The presence of such additional channels also increases the volume of the footprint of the parallel plate heat exchanger and/or the footprint of an electronic device incorporating the parallel plate heat exchanger, and also increases the weight of the parallel plate heat exchanger and/or the weight of an electronic device incorporating the parallel plate heat exchanger. Such increases in volume and/or weight are often undesirable, and are especially undesirable for device implementations in which compactness and/or reduced (e.g., minimized) weight are design considerations for the device, as is often the case with wearable devices. For example, the increased volume that would necessarily be consumed by incorporating additional channels into a parallel plate heat exchanger to disperse an exhaust flow therefrom may instead be utilized to provide additional functionality associated with an electronic device incorporating such a parallel plate heat exchanger. Thus, a need exists for a heat exchanger that is capable of dispersing an exhaust flow in multiple directions while maintaining a reduced (e.g., minimal) footprint and maintaining a reduced (e.g., minimal) weight.

Example apparatus, devices, articles of manufacture, systems and methods disclosed herein include a metal foam heat exchanger to disperse an exhaust flow in multiple directions. By dispersing the exhaust flow in multiple directions, example apparatus, devices, articles of manufacture, systems and methods disclosed herein advantageously reduce the velocity at which the exhaust flow emerges from and/or exits the metal foam heat exchanger relative to the velocity at which the exhaust flow would otherwise emerge from and/or exit a parallel plate heat exchanger of relatively the same size and shape as the metal foam heat exchanger. Such a reduced velocity exhaust flow is particularly advantageous for wearable devices incorporating such metal foam heat exchangers. For such wearable devices, the reduced velocity exhaust flow provides for an increased level and/or degree of user comfort relative to the level and/or degree of comfort otherwise experienced by the user when subjected to a high exhaust flow velocity produced by a parallel plate heat exchanger. In some examples, the metal foam heat exchanger achieves the aforementioned benefits and advantages while maintaining a volume and/or weight that is/are comparable to, and/or improved relative to, the volume and/or weight of a conventional parallel plate heat exchanger having a unidirectional exhaust flow.

In some disclosed examples, a wearable device constructed in accordance with the teachings of this disclosure comprises a housing having a form factor sized to be worn by a human. In some disclosed examples, the housing has an exhaust port. In some disclosed examples, the wearable device includes a heat generating device carried within the housing. In some disclosed examples, the heat generating device generates heat in operation. In some disclosed examples, the wearable device includes a metal foam heat exchanger disposed within the housing adjacent the exhaust port. In some disclosed examples, the metal foam heat exchanger is to receive heat generated by the heat generating device. In some disclosed examples, the metal foam heat exchanger defines multiple flow paths within the housing to disperse exhaust in multiple directions to reduce a flow velocity of the exhaust exiting the exhaust port.

In some disclosed examples, an electronic device constructed in accordance with the teachings of this disclosure comprises means for generating a flow of a fluid. In some disclosed examples, the electronic device includes a metal foam heat exchanger in fluid communication with the means for generating. In some disclosed examples, the metal foam heat exchanger includes an intake to receive the flow of the fluid from the means for generating. In some disclosed examples, the metal foam heat exchanger includes a first exhaust means for exhausting a first portion of the flow of the fluid in a first direction. In some disclosed examples, the first exhaust means is in fluid communication with the intake. In some disclosed examples, the metal foam heat exchanger includes a second exhaust means for exhausting a second portion of the flow of the fluid in a second direction different from the first direction. In some disclosed examples, the second exhaust means is in fluid communication with the intake.

In some disclosed examples, a method of manufacturing a wearable device in accordance with the teachings of this disclosure comprises providing a housing having a form factor sized to be worn by a human. In some disclosed examples, the housing has an exhaust port. In some disclosed examples, the method includes mounting electronics within the housing. In some disclosed examples, the electronics are to generate heat in operation. In some disclosed examples, the method includes positioning a metal foam heat exchanger within the housing adjacent the exhaust port. In some disclosed examples, the metal foam heat exchanger is to receive heat generated by the electronics. In some disclosed examples, the metal foam heat exchanger defines tortuous flow paths within the housing to disperse exhaust in multiple directions to reduce a flow velocity of the exhaust exiting the exhaust port.

In some disclosed examples, a method of improving wearability of an electronic device in accordance with the teachings of this disclosure comprises generating a flow of air having a first velocity the electronic device. In some disclosed examples, the method includes exhausting the flow of air from the electronic device by dispersing the flow of air into first and second exhaust streams with a metal foam heat exchanger. In some disclosed examples, the first exhaust stream has a first direction and a second velocity, and the second exhaust stream has a second direction and a third velocity. In some disclosed examples, the second direction is different from the first direction. In some disclosed examples, the second velocity and the third velocity are lower than the first velocity. In some disclosed examples, the metal foam heat exchanger is to receive heat generated within the electronic device and transfer the heat to the flow of air.

Figure 2:
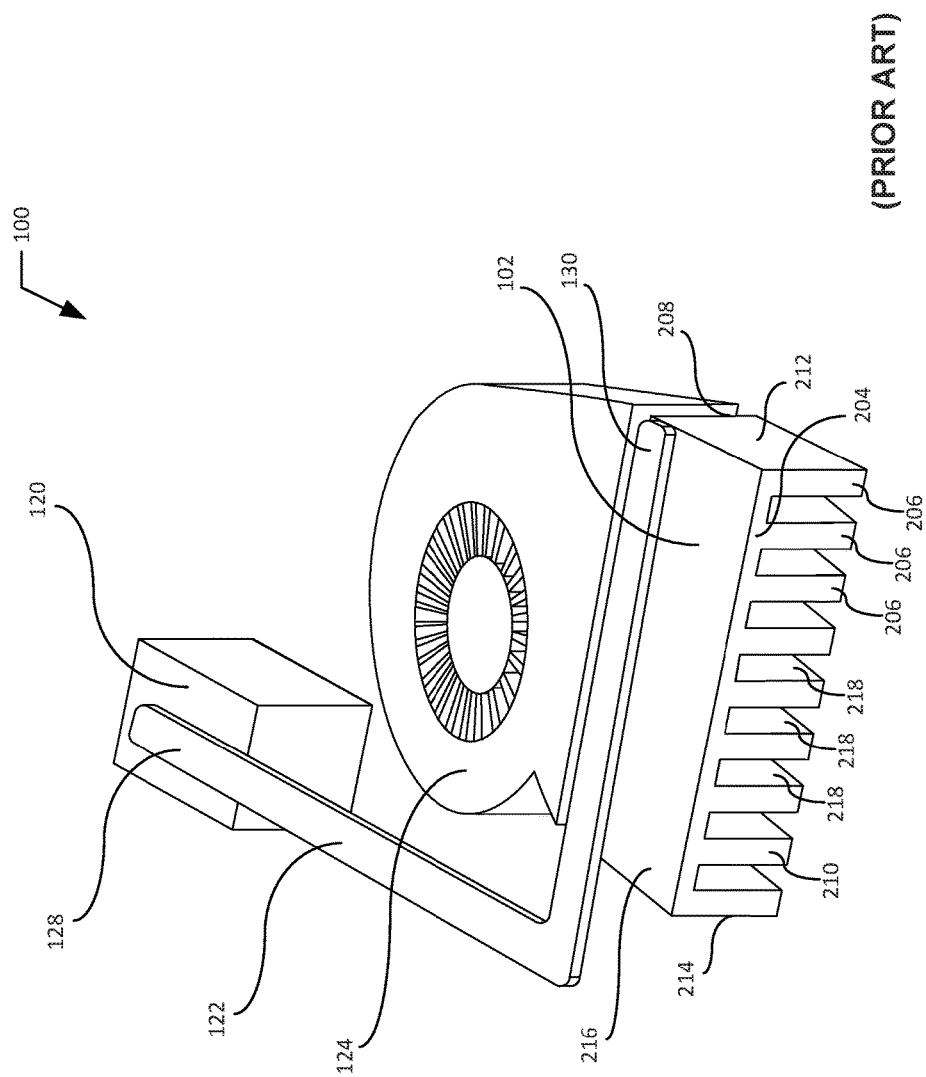
FIG. 2 is a perspective view of the electronic device of FIG. 1 with the housing of the electronic device removed.
Figure 3:
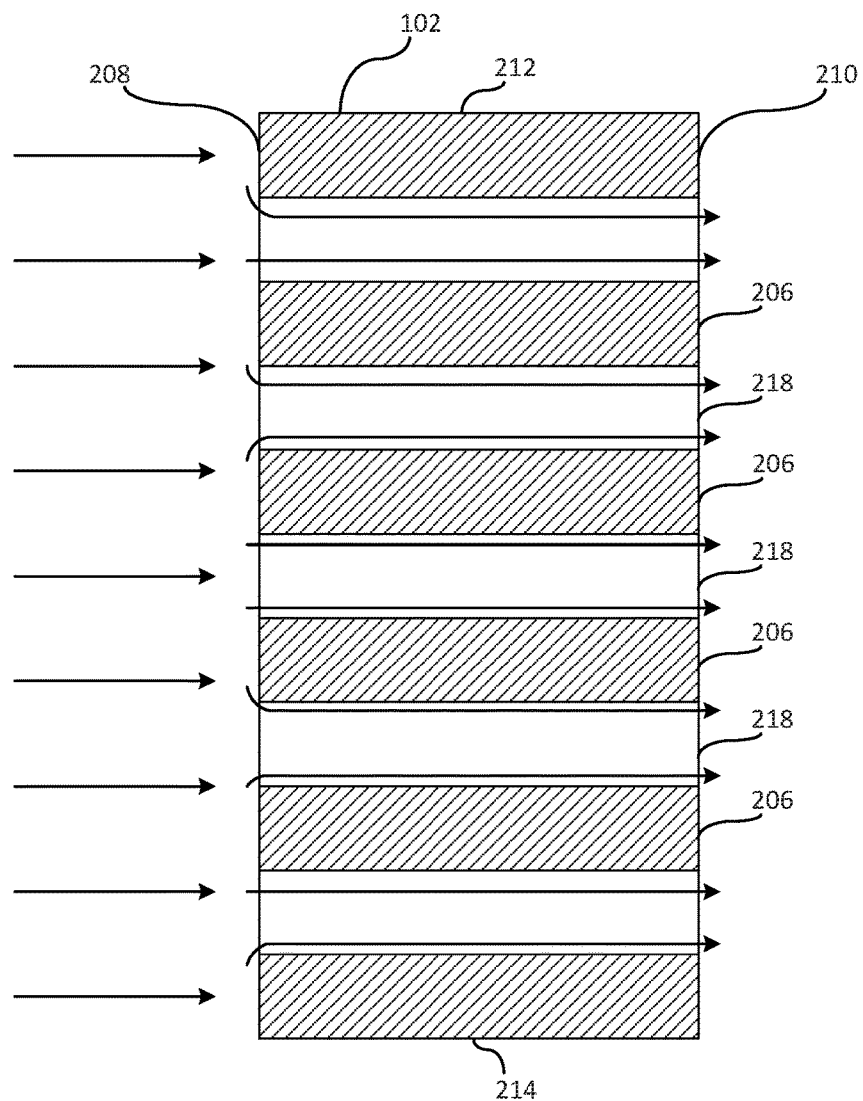
FIG. 3 is a plan view of the parallel plate heat exchanger of FIGS. 1 and 2 in isolation.

Before describing the details of an example electronic device including an example metal foam heat exchanger for dispersing exhaust flow, a description of a prior art electronic device 100 including a parallel plate heat exchanger 102 is provided in connection with FIGS. 1-3. FIG. 1 is a perspective view of the electronic device 100 including the parallel plate heat exchanger 102. FIG. 2 is a perspective view of the electronic device 100 of FIG. 1 with the housing of the electronic device 100 removed. FIG. 3 is a plan view of the parallel plate heat exchanger 102 of FIGS. 1 and 2 in isolation.

The parallel plate heat exchanger 102 of FIGS. 1-3 includes a base 204 and a plurality of parallel plates 206 extending orthogonally away from the base 204. The base 204 and the parallel plates 206 define a generally rectangular profile. The parallel plate heat exchanger 102 has a generally cuboidal shape. The parallel plate heat exchanger 102 includes a front surface 208, a rear surface 210 opposite the front surface 208, a first side surface 212, a second side surface 214 opposite the first side surface 212, and a top surface 216 of the parallel plate heat exchanger 102. Front and rear are relative terms and are selected to reference an expected direction of airflow (from the front surface 208 toward the rear surface 210), but other nomenclature can be selected. The parallel plates 206 further define a plurality of channels and/or gaps 218 running from the front surface 208 of the parallel plate heat exchanger 102 to the rear surface 210 of the parallel plate heat exchanger 102. The channels and/or gaps 218 are configured to enable a flow of a fluid (e.g., an airflow) to pass from the front surface 208 of the parallel plate heat exchanger 102 through to the rear surface 210 of the parallel plate heat exchanger 102. The first side surface 212, second side surface 214 and top surface 216 of the parallel plate heat exchanger 102 are non-porous, and accordingly prevent the flow of the fluid from traveling in a direction other than from the front surface 208 of the parallel plate heat exchanger 102 though the channels and/or gaps 218 to the rear surface 210 of the parallel plate heat exchanger 102. Thus, a flow of a fluid entering the front surface 208 of the parallel plate heat exchanger 102 will be guided in a unidirectional manner via the parallel plates 206 through the channels and/or gaps 218 to the rear surface 210 of the parallel plate heat exchanger 102.

The electronic device 100 of FIGS. 1 and 2 further includes a heat generating component 120, a heat pipe 122, a fan 124, and a housing 126. As used herein, the term "heat generating component" refers to electronics and/or an electronic component, unit, module and/or device that generates heat in operation. In the illustrated example of FIGS. 1 and 2, the heat generating component 120 is a processor, a controller and/or a CPU that generates heat as a result of performing one or more computing processes and/or functions, but it could represent other analog or digital circuitry.

The heat pipe 122 of FIGS. 1 and 2 includes a first end 128 coupled to the heat generating component 120 and a second end 130 coupled to the base 204 and/or the top surface 216 of the parallel plate heat exchanger 102. The heat pipe 122 transfers heat generated by the heat generating component 120 to the base 204 and/or the top surface 216 of the parallel plate heat exchanger 102. Heat received by the base 204 and/or the top surface 216 of the parallel plate heat exchanger 102 from the heat pipe 122 is distributed to and/or among the parallel plates 206 of the parallel plate heat exchanger 102.

The fan 124 of FIGS. 1 and 2 generates a flow of a fluid (e.g., an airflow). The fan 124 is in fluid communication with and/or adjacent the front surface 208 of the parallel plate heat exchanger 102 such that the flow of fluid generated by the fan 124 is received at the front surface 208 of the parallel plate heat exchanger 102. When received at the front surface 208 of the parallel plate heat exchanger 102, the flow of fluid generated by the fan 124 has a temperature that is relatively lower (e.g., cooler) than that of the parallel plates 206 of the parallel plate heat exchanger 102 (while parallel plate heat exchanger 102 carries the heat transferred from the heat generating component 120 via the heat pipe 122). Accordingly, the temperature of the fluid increases as the fluid flows from the front surface 208 of the parallel plate heat exchanger 102 though the channels and/or gaps 218 defined by the relatively higher temperature parallel plates 206 of the parallel plate heat exchanger 102 and emerges and/or exits at the rear surface 210 of the parallel plate heat exchanger 102. As a result, the fluid removes heat from the parallel plate heat exchanger 102 and exhausts it to outside the housing 126.

The housing 126 of FIG. 1 houses, encases and/or encloses the parallel plate heat exchanger 102, the heat generating component 120, the heat pipe 122 and the fan 124 of the electronic device 100 of FIGS. 1 and 2. The housing 126 includes an exhaust port 132 aligned with the rear surface 210 of the parallel plate heat exchanger 102. The exhaust port 132 of the housing 126 is in fluid communication with and/or adjacent the rear surface 210 of the parallel plate heat exchanger 102 such that the flow of fluid passing through the channels and/or gaps 218 of the parallel plate heat exchanger 102 is received by and/or at the exhaust port 132 as the flow emerges and/or exits from the rear surface 210 of the parallel plate heat exchanger 102.

Figure 4:
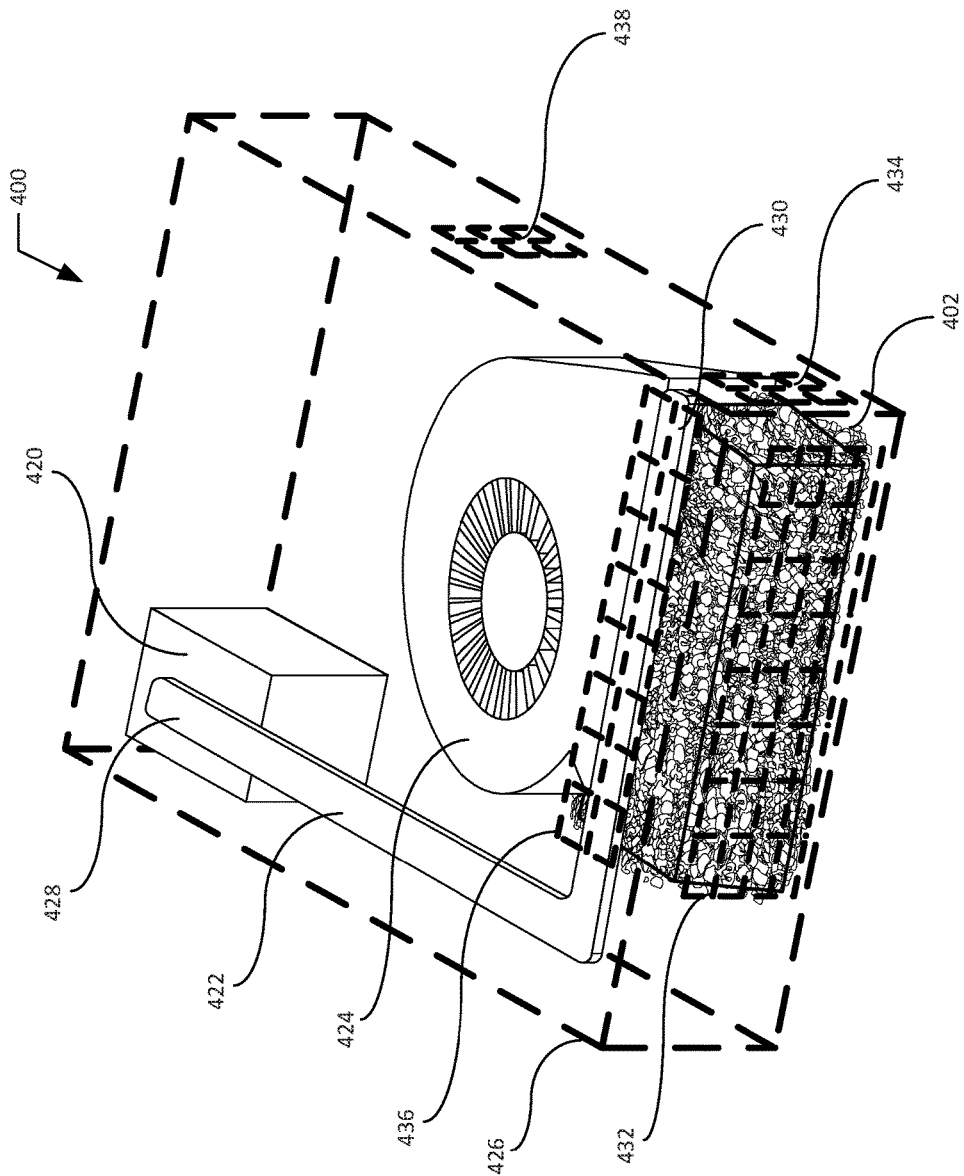
FIG. 4 is a perspective view of an example electronic device including an example metal foam heat exchanger constructed in accordance with the teachings of this disclosure.
Figure 5:
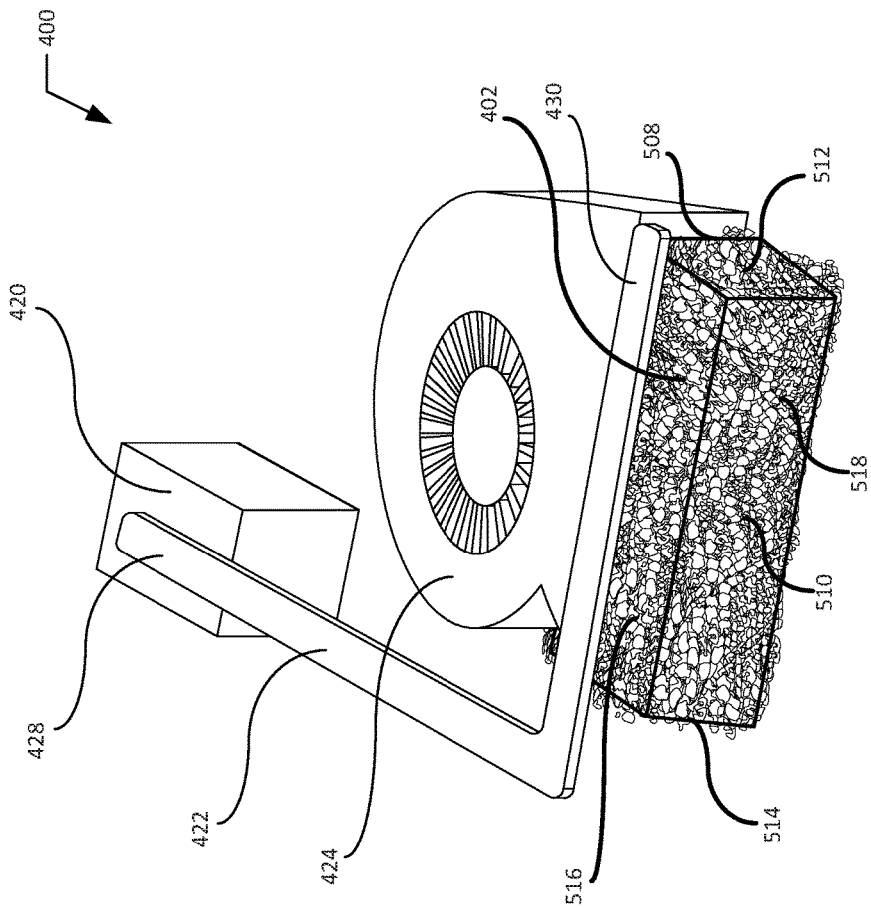
FIG. 5 is a perspective view of the example electronic device of FIG. 4 with the example housing of the example electronic device removed.
Figure 6:
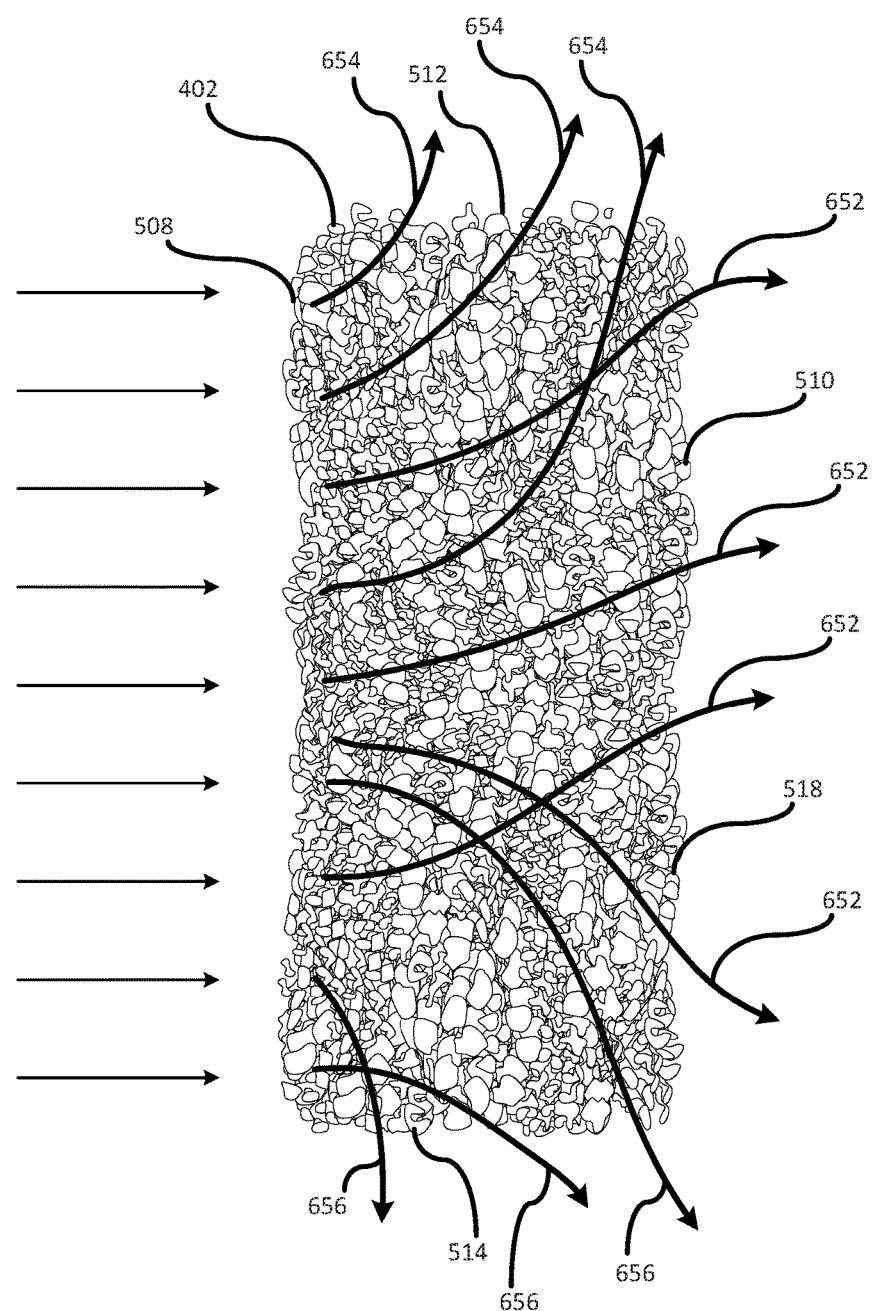
FIG. 6 is a plan view of the example metal foam heat exchanger of FIGS. 4 and 5 in isolation.

As described above, the electronic device 100 of FIGS. 1 and 2 includes a parallel plate heat exchanger 102 that provides for a unidirectional exhaust flow out of the electronic device 100. The unidirectional exhaust flow provided by the parallel plate heat exchanger 102 may be of an undesirably high velocity of flow. Unlike the electronic device 100 of FIG. 1, example electronic devices disclosed herein include a metal foam heat exchanger for dispersing exhaust flow in multiple directions to provide a reduced velocity exhaust flow. FIG. 4 is a perspective view of an example electronic device 400 including an example metal foam heat exchanger 402 constructed in accordance with the teachings of this disclosure. FIG. 5 is a perspective view of the example electronic device 400 of FIG. 4 with the housing of the example electronic device 400 removed. FIG. 6 is a plan view of the example metal foam heat exchanger 402 of FIGS. 4 and 5 in isolation. The example electronic device 400 of FIGS. 4 and 5 may be implemented as any type of electronic device capable of performing one or more computing and/or control processes and/or functions. For example, the electronic device 400 of FIGS. 4 and 5 may be implemented as a server, a desktop computer, a laptop computer, a tablet, a smartphone or a wearable device.

In the example of FIGS. 4-6, the example metal foam heat exchanger 402 has a generally rectangular profile and a generally cuboidal shape approximating those of the parallel plate heat exchanger 102 of FIGS. 1-3 described above. The shape of the example metal foam heat exchanger 402 of FIGS. 4-6 defines an example front surface 508, an example rear surface 510 opposite the front surface 508, an example first side surface 512, an example second side surface 514 opposite the first side surface 512, and an example top surface 516 of the metal foam heat exchanger 402. Front and rear are relative terms and are selected to reference an expected direction of airflow (from the example front surface 508 toward the example rear surface 510), but other nomenclature can be selected. Although the example metal foam heat exchanger 402 of FIGS. 4-6 has a generally rectangular profile and a generally cuboidal shape, the metal foam heat exchanger 402 may alternatively be of any profile and/or shape, including any regular, non-rectangular, oval, circular, and/or irregular geometric profile and/or shape. In some examples, the metal foam heat exchanger 402 may be configured and/or shaped to substantially fill a volume, space and/or compartment defined by a housing of an electronic device within which the metal foam heat exchanger 402 is incorporated. In some examples, the housing of the electronic device has a form factor sized to be worn by a human.

The example metal foam heat exchanger 402 of FIGS. 4-6 further includes example pores 518. The example pores 518 of the metal foam heat exchanger 402 of FIGS. 4-6 may be of any size, shape, density and/or configuration such that the associated porosity of the metal foam heat exchanger 402 enables a flow of a fluid received by and/or at the front surface 508 of the metal foam heat exchanger 402 to be dispersed and/or exhausted from the metal foam heat exchanger 402 in multiple directions.

The example pores 518 of the metal foam heat exchanger 402 define multiple fluid passageways and/or multiple tortuous non-linear flow paths to disperse a flow of fluid and/or an exhaust flow in multiple directions to reduce a flow velocity of the fluid and/or the exhaust exiting the metal foam heat exchanger 402 and/or exiting an exhaust port of a housing of the example electronic device 400. In the illustrated example of FIGS. 5 and 6, some and/or all of the pores 518 are interconnected and/or otherwise configured to enable a flow of a fluid (e.g., an airflow) received by and/or at a first surface (e.g., the front surface 508) of the metal foam heat exchanger 402 to be dispersed to other surfaces (e.g., the rear surface 510, the first side surface 512, the second side surface 514 and/or the top surface 516) of the metal foam heat exchanger 402. For example, the pores 518 of FIGS. 5 and 6 may define example first fluid passageways 652 that enable a first portion of a flow of a fluid received by and/or at the front surface 508 of the metal foam heat exchanger 402 to be dispersed to and/or to emerge from the rear surface 510 of the metal foam heat exchanger 402 in a first direction. The pores 518 may further define example second fluid passageways 654 that enable a second portion of the flow of the fluid received by and/or at the front surface 508 of the metal foam heat exchanger 402 to be dispersed to and/or to emerge from the first side surface 512 of the metal foam heat exchanger 402 in a second direction that is generally orthogonal to the first direction. The pores 518 may further define example third fluid passageways 656 that enable a third portion of the flow of the fluid received by and/or at the front surface 508 of the metal foam heat exchanger 402 to be dispersed to and/or to emerge from the second side surface 514 of the metal foam heat exchanger 402 in a third direction opposite the second direction. The pores 518 may further define example fourth fluid passageways (not shown) that enable a fourth portion of the flow of the fluid received by and/or at the front surface 508 of the metal foam heat exchanger 402 to be dispersed to and/or to emerge from the top surface 516 of the metal foam heat exchanger 402 in a fourth direction that is generally orthogonal to each of the first, second and third directions. Thus, the pores 518 of the metal foam heat exchanger 402 enable a flow of a fluid entering a first surface (e.g., the front surface 508) of the metal foam heat exchanger 402 to emerge and/or exit from the metal foam heat exchanger 402 in multiple different directions such that the exhaust flow is dispersed, and, due to the tortuous non-linear flow paths through the metal foam structure, the velocity of the exhaust flow is reduced relative to the velocity upon entering the metal foam structure and is lower than what could be accomplished by a parallel plate heat exchanger.

In the example of FIGS. 4-6, the example front surface 508 is an intake for receiving a flow of a fluid from the example fan 424. Each of the example rear surface 510, the example first side surface 512, the example second side surface 514 and/or the example top surface 516 of the metal foam heat exchanger 402 may be a first means for exhausting a first portion of the flow of the fluid in a first direction. Similarly, each of the example rear surface 510, the example first side surface 512, the example second side surface 514 and/or the example top surface 516 of the metal foam heat exchanger 402 may be a second means for exhausting a second portion of the flow of the fluid in a second direction different from the first direction.

The example electronic device 400 of FIGS. 4 and 5 further includes an example heat generating component 420, an example heat pipe 422, an example fan 424, and an example housing 426. In the illustrated example of FIGS. 4 and 5, the example heat generating component 420 is a processor (e.g., a graphics processor, a microprocessor, etc.), a controller and/or a CPU that generates heat as a result of performing one or more computing and/or control processes and/or functions. The example heat generating component 420 may alternatively be implemented as a hard disk drive (HDD), an optical disk drive (ODD), or any other component and/or group of components that generate(s) heat in operation.

The example heat pipe 422 of FIGS. 4 and 5 transfers heat generated by the heat generating component 420 to the metal foam heat exchanger 402. The example heat pipe 422 may be of any size, shape and/or configuration. In the illustrated example of FIGS. 4 and 5, the example heat pipe 422 includes an example first end 428 coupled to the heat generating component 420 and an example second end 430 coupled to the top surface 516 of the metal foam heat exchanger 402. Heat received by the top surface 516 of the metal foam heat exchanger 402 from the heat pipe 422 is distributed to and/or among the porous metal foam structure that defines the pores 518 of the metal foam heat exchanger 402. Although the illustrated example of FIGS. 4 and 5 shows the heat generating component 420 of the electronic device 400 being coupled to the metal foam heat exchanger 402 of the electronic device 400 via the heat pipe 422, in other examples the heat generating component 420 may be directly coupled to the metal foam heat exchanger 402. In such other examples, heat generated by the heat generating component 420 may be transferred from the heat generating component 420 directly to the metal foam heat exchanger 402 without the need for the example heat pipe 422 of FIGS. 4 and 5.

The example fan 424 of FIGS. 4 and 5 generates and/or is a means for generating a flow of a fluid (e.g., an airflow). The example fan 424 may be of any size, shape and/or configuration. In the illustrated example of FIGS. 4 and 5, the fan 424 is in fluid communication with and/or adjacent the front surface 508 of the metal foam heat exchanger 402 such that the flow of fluid generated by the fan 424 is received by and/or at the front surface 508 of the metal foam heat exchanger 402. When received at the front surface 508 of the metal foam heat exchanger 402, the flow of fluid generated by the fan 424 has a temperature that is relatively lower (e.g., cooler) than that of the porous metal foam structure of the metal foam heat exchanger 402 because the metal foam heat exchanger 402 holds heat transferred from the heat generating component 420 via the heat pipe 422. Accordingly, the temperature of the fluid increases as the fluid flows from the front surface 508 of the metal foam heat exchanger 402 though the pores 518 defined by the relatively higher (e.g., warmer) temperature porous metal foam structure of the metal foam heat exchanger 402. In other words, heat is transferred from the metal foam heat exchanger 402 to the fluid. As such, when the fluid emerges and/or exits at the rear surface 510, the first side surface 512, the second side surface 514 and/or the top surface 516 of the metal foam heat exchanger 402, it carries the transferred heat away from the electronic device 400.

The example housing 426 of FIG. 4 houses, encases and/or generally encloses the example metal foam heat exchanger 402, the example heat generating component 420, the example heat pipe 422 and the example fan 424 of the example electronic device 400 of FIGS. 4 and 5. The example housing 426 may be of any size, shape and/or configuration, and may include and/or define any number (e.g., 1, 2, 3, etc.) of compartments. In some examples, the housing 426 may have a form factor sized to be worn by a human (e.g., the housing may form part of an article of clothing or an accessory). In some examples, the housing 426 of the electronic device 400 may include multiple compartments that are attached to one another. In other examples, the housing 426 of the electronic device 400 may include multiple compartments that are detached from one another. The example housing 426 may be composed of any material and/or combination of materials including, for example, metal(s), plastic(s), fabric(s), composite(s), etc.

In the illustrated example of FIG. 4, the example housing 426 includes an example first exhaust port 432 aligned with the rear surface 510 of the metal foam heat exchanger 402, an example second exhaust port 434 aligned with the first side surface 512 of the metal foam heat exchanger 402, and an example third exhaust port 436 aligned with the top surface 516 of the metal foam heat exchanger 402. In some examples, one or more of the first, second and/or third ports 432, 434, 436 directs the flow of the fluid and/or the exhaust flow away from a body contact surface of the example electronic device 400 when implemented as a wearable device. This directing away from the wearer increases comfort for the wearer by reducing (e.g., avoiding) blowing hot air on the body of the wearer. The example housing 426 of FIG. 4 further includes an example intake port 438 to supply a fluid (e.g. air) to the fan 424.

In the illustrated example of FIG. 4, the housing 426 does not include a linear duct (e.g., a metallic duct) between the metal foam heat exchanger 402 and any of the first, second or third exhaust ports 432, 434, 436. The absence of a linear duct between the metal foam heat exchanger 402 and any of the first, second or third exhaust ports 432, 434, 436 reduces the amount of space within the housing 426 that is required for dispersing the flow of the fluid and/or the exhaust flow in multiple different directions relative to parallel plate heat exchangers. As used herein, the term "linear duct" excludes ducts formed from sponge and/or foam material. In some examples, the housing 426 may include a non-linear duct (e.g., a duct fabricated from sponge or foam material) between the metal foam heat exchanger 402 and any of the first, second or third exhaust ports 432, 434, 436 to prevent the flow of the fluid exiting and/or emerging from the metal foam heat exchanger 402 from recirculating back into the electronic device 400.

In some examples, the first exhaust port 432 of the housing 426 is in fluid communication with and/or adjacent the rear surface 510 of the metal foam heat exchanger 402 such that the first portion of the flow of fluid passing through the pores 518 of the metal foam heat exchanger 402 is received by and/or at the first exhaust port 432 as the first portion of the flow emerges and/or exits from the rear surface 510 of the metal foam heat exchanger 402. In some examples, the second exhaust port 434 of the housing 426 is in fluid communication with and/or adjacent the first side surface 512 of the metal foam heat exchanger 402 such that the second portion of the flow of fluid passing through the pores 518 of the metal foam heat exchanger 402 is received by and/or at the second exhaust port 434 as the second portion of the flow emerges and/or exits from the first side surface 512 of the metal foam heat exchanger 402. In some examples, the third exhaust port 436 of the housing 426 is in fluid communication with and/or adjacent the top surface 516 of the metal foam heat exchanger 402 such that the fourth portion of the flow of fluid passing through the pores 518 of the metal foam heat exchanger 402 is received by and/or at the third exhaust port 436 as the fourth portion of the flow emerges and/or exits from the top surface 516 of the metal foam heat exchanger 402.

By dispersing the exhaust flow in multiple directions by directing the fluid through multiple tortuous non-linear paths, the example metal foam heat exchanger 402 of the example electronic device 400 of FIGS. 4 and 5 advantageously reduces the velocity at which the exhaust flow emerges from and/or exits the metal foam heat exchanger 402 and/or the electronic device 400 of FIGS. 4 and 5 relative to the velocity at which the exhaust flow emerges from and/or exits the parallel plate heat exchanger 102 and/or the electronic device 100 of FIG. 1. The example metal foam heat exchanger 402 of FIGS. 4-6 achieves this benefit while maintaining a volume and/or weight that is/are comparable to, and/or improved (e.g., reduced) relative to, the volume and/or weight of the parallel plate heat exchanger 102 of FIG. 1 having a unidirectional exhaust flow.

While an example manner of implementing an example electronic device 400 having an example metal foam heat exchanger 402 is illustrated in FIGS. 4-6, one or more of the structures, components, elements and/or devices illustrated in FIGS. 4-6 may be combined, divided, re-arranged, omitted, eliminated, duplicated and/or implemented in any other way.

Figure 7:
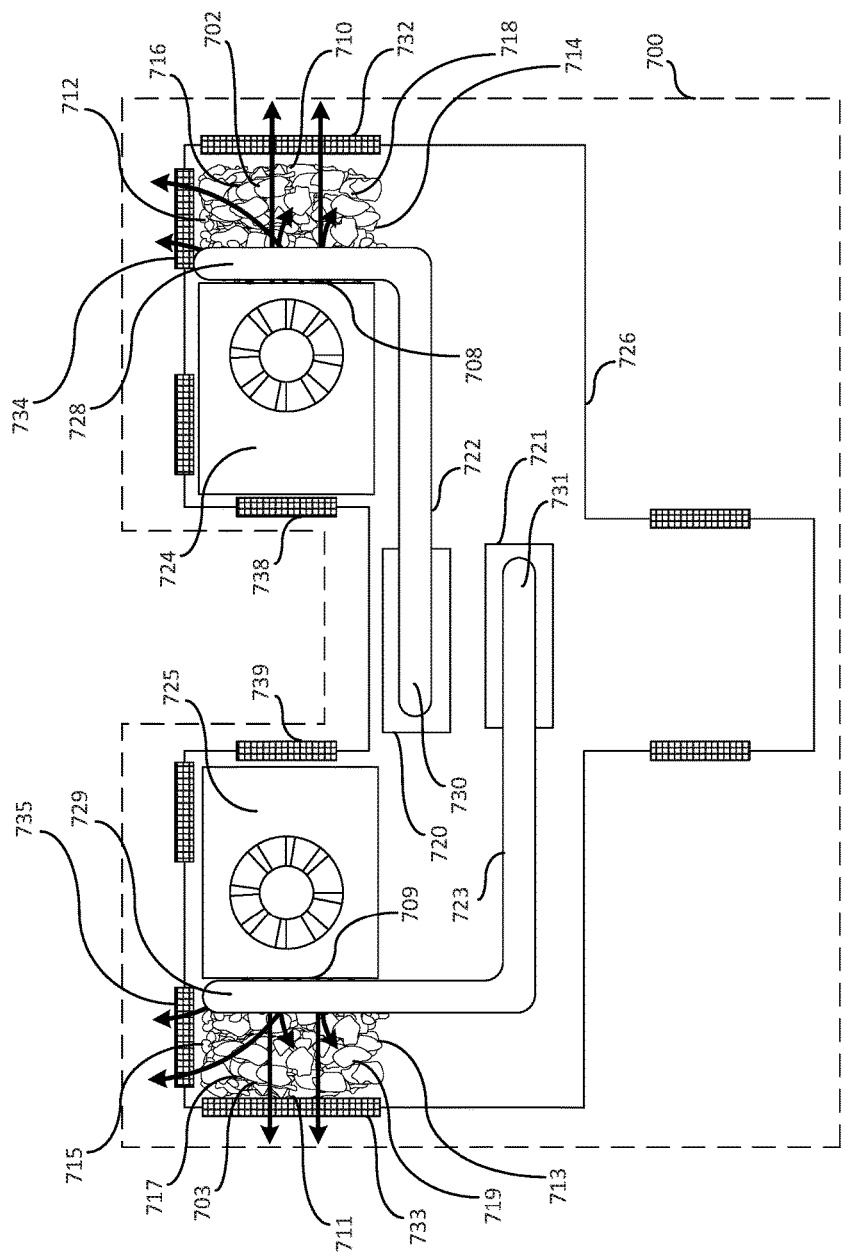
FIG. 7 is a partial cutaway view of an example wearable device including example metal foam heat exchangers constructed in accordance with the teachings of this disclosure.

In some examples, the example electronic device 400 of FIGS. 4 and 5 may constitute and/or be incorporated into a wearable device. FIG. 7 is a partial cutaway view of an example wearable device 700 including first and second example metal foam heat exchangers 702, 703 constructed in accordance with the teachings of this disclosure. In the illustrated example of FIG. 7, the wearable device 700 is a vest that houses, encases, generally encloses and/or carries the first and second example metal foam heat exchangers 702, 703, first and second example heat generating components 720, 721, first and second example heat pipes 722, 723, and first and second example fans 724, 725. The aforementioned structures of the example wearable device 700 may be housed, encased, generally enclosed and/or carried by an example housing 726 of the wearable device 700 having multiple (e.g., 2, 3, 4, etc.) compartments.

In the illustrated example of FIG. 7, each of the first and second example metal foam heat exchangers 702, 703 is implemented in a manner that is consistent with the implementation of the example metal foam heat exchanger 402 of FIGS. 4-6 described above. Accordingly, the shape of the first example metal foam heat exchanger 702 of FIG. 7 defines an example front surface 708, an example rear surface 710 opposite the front surface 708, an example first side surface 712, an example second side surface 714 opposite the first side surface 712, and an example top surface 716 of the first metal foam heat exchanger 702. The first example metal foam heat exchanger 702 of FIG. 7 further includes example pores 718. The example pores 718 of the first metal foam heat exchanger 702 define multiple fluid passageways and/or multiple tortuous non-linear flow paths to disperse a flow of fluid and/or an exhaust flow in multiple directions to reduce a flow velocity of the fluid and/or the exhaust exiting the first metal foam heat exchanger 702 and/or exiting an exhaust port of a housing of the example wearable device 700. Some and/or all of the pores 718 of the first example metal foam heat exchanger 702 are interconnected and/or otherwise configured to enable a flow of a fluid (e.g., an airflow) received by and/or at a first surface (e.g., the front surface 708) of the first metal foam heat exchanger 702 to be dispersed to other surfaces (e.g., the rear surface 710, the first side surface 712, the second side surface 714 and/or the top surface 716) of the first metal foam heat exchanger 702. The dispersing of the flow of the fluid by the first metal foam heat exchanger 702 of FIG. 7 occurs via fluid passageways (not shown) defined by the pores 718 of the first metal foam heat exchanger 702 in a manner that is consistent with that described above in connection with the example first, second and third fluid passageways 652, 654, 656 defined by the example pores 518 of the example metal foam heat exchanger 402 of FIGS. 4-6. Thus, the pores 718 of the first metal foam heat exchanger 702 enable a flow of a fluid entering a first surface (e.g., the front surface 708) of the first metal foam heat exchanger 702 to emerge and/or exit from the first metal foam heat exchanger 702 in multiple different directions such that the exhaust flow is dispersed, and, due to the tortuous non-linear flow paths through the metal foam structure, the velocity of the exhaust flow is reduced relative to the velocity upon entering the metal foam structure and is lower than what could be accomplished by a parallel plate heat exchanger.

In the example of FIG. 7, the example front surface 708 is an intake for receiving a flow of a fluid from the example fan 724. Each of the example rear surface 710, the example first side surface 712, the example second side surface 714 and/or the example top surface 716 of the first metal foam heat exchanger 702 may be a first means for exhausting a first portion of the flow of the fluid in a first direction. Similarly, each of the example rear surface 710, the example first side surface 712, the example second side surface 714 and/or the example top surface 716 of the first metal foam heat exchanger 402 may be a second means for exhausting a second portion of the flow of the fluid in a second direction different from the first direction.

Similarly, the shape of the second example metal foam heat exchanger 703 of FIG. 7 defines an example front surface 709, an example rear surface 711 opposite the front surface 709, an example first side surface 713, an example second side surface 715 opposite the first side surface 713, and an example top surface 717 of the second metal foam heat exchanger 703. The second example metal foam heat exchanger 703 of FIG. 7 further includes example pores 719.

The example pores 719 of the second metal foam heat exchanger 703 define multiple fluid passageways and/or multiple tortuous non-linear flow paths to disperse a flow of fluid and/or an exhaust flow in multiple directions to reduce a flow velocity of the fluid and/or the exhaust exiting the second metal foam heat exchanger 703 and/or exiting an exhaust port of a housing of the example wearable device 700. Some and/or all of the pores 719 of the second example metal foam heat exchanger 703 are interconnected and/or otherwise configured to enable a flow of a fluid (e.g., an airflow) received by and/or at a first surface (e.g., the front surface 709) of the second metal foam heat exchanger 703 to be dispersed to other surfaces (e.g., the rear surface 711, the first side surface 713, the second side surface 715 and/or the top surface 717) of the second metal foam heat exchanger 703. The dispersing of the flow of the fluid by the second metal foam heat exchanger 703 of FIG. 7 occurs via fluid passageways (not shown) defined by the pores 719 of the second metal foam heat exchanger 703 in a manner that is consistent with that described above in connection with the example first, second and third fluid passageways 652, 654, 656 defined by the example pores 518 of the example metal foam heat exchanger 402 of FIGS. 4-6. Thus, the pores 719 of the second metal foam heat exchanger 703 enable a flow of a fluid entering a first surface (e.g., the front surface 709) of the second metal foam heat exchanger 703 to emerge and/or exit from the second metal foam heat exchanger 703 in multiple different directions such that the exhaust flow is dispersed, and, due to the tortuous non-linear flow paths through the metal foam structure, the velocity of the exhaust flow is reduced relative to the velocity upon entering the metal foam structure and is lower than what could be accomplished by a parallel plate heat exchanger.

In the example of FIG. 7, the example front surface 709 is an intake for receiving a flow of a fluid from the example fan 725. Each of the example rear surface 711, the example first side surface 713, the example second side surface 715 and/or the example top surface 717 of the second metal foam heat exchanger 703 may be a first means for exhausting a first portion of the flow of the fluid in a first direction. Similarly, each of the example rear surface 711, the example first side surface 713, the example second side surface 715 and/or the example top surface 717 of the second metal foam heat exchanger 703 may be a second means for exhausting a second portion of the flow of the fluid in a second direction different from the first direction.

In the example of FIG. 7, each of the first and second example heat generating components 720, 721 is implemented in a manner that is consistent with the implementation of the example heat generating component 420 of FIGS. 4 and 5 described above. In the illustrated example of FIG. 7, the first example heat generating component 720 is a processor (e.g., a graphics processor, a microprocessor, etc.) and/or a CPU that generates heat as a result of performing one or more computing and/or control processes and/or functions. The second example heat generating component 721 is also a processor (e.g., a graphics processor, a microprocessor, etc.) and/or a CPU that generates heat as a result of performing one or more computing and/or control processes and/or functions.

In the example of FIG. 7, each of the first and second example heat pipes 722, 723 is implemented in a manner that is consistent with the implementation of the example heat pipe 422 of FIGS. 4 and 5 described above. Accordingly, the first example heat pipe 722 of FIG. 7 includes an example first end 728 coupled to the first heat generating component 720 and an example second end 730 coupled to the top surface 716 of the first metal foam heat exchanger 702. The first heat pipe 722 transfers heat generated by the first heat generating component 720 to the top surface 716 of the first metal foam heat exchanger 702. Heat received by the top surface 716 of the first metal foam heat exchanger 702 from the first heat pipe 722 is distributed to and/or among the porous metal foam structure that defines the pores 718 of the first metal foam heat exchanger 702. Similarly, the second example heat pipe 723 of FIG. 7 includes an example first end 729 coupled to the second heat generating component 721 and an example second end 731 coupled to the top surface 717 of the second metal foam heat exchanger 703. The second heat pipe 723 transfers heat generated by the second heat generating component 721 to the top surface 717 of the second metal foam heat exchanger 703. Heat received by, the top surface 717 of the second metal foam heat exchanger 703 from the second heat pipe 723 is distributed to and/or among the porous metal foam structure that defines the pores 719 of the second metal foam heat exchanger 703.

In the example of FIG. 7, each of the first and second example fans 724, 725 is implemented in a manner that is consistent with the implementation of the example fan 424 of FIGS. 4 and 5 described above. Accordingly, the first example fan 724 of FIG. 7 generates and/or is a means for generating a flow of a fluid (e.g., an airflow) toward the first example metal foam heat exchanger 702. In the illustrated example of FIG. 7, the first fan 724 is in fluid communication with and/or adjacent the front surface 708 of the first metal foam heat exchanger 702 such that the flow of fluid generated by the first fan 724 is received by and/or at the front surface 708 of the first metal foam heat exchanger 702. When received at the front surface 708 of the first metal foam heat exchanger 702, the flow of fluid generated by the first fan 724 has a temperature that is relatively lower cooler) than that of the porous metal foam structure of the first metal foam heat exchanger 702 because the first metal foam heat exchanger 702 holds heat transferred from the first heat generating component 720 via the first heat pipe 722. Accordingly, the temperature of the fluid increases as the fluid flows from the front surface 708 of the first metal foam heat exchanger 702 though the pores 718 defined by the relatively higher (e.g., warmer) temperature porous metal foam structure of the first metal foam heat exchanger 702. In other words, heat is transferred from the first metal foam heat exchanger 402 to the fluid. As such, when the fluid emerges and/or exits at the rear surface 710, the first side surface 712, the second side surface 714 and/or the top surface 716 of the first metal foam heat exchanger 702, it carries the transferred heat away from the wearable device 700.

Similarly, the second example fan 725 of FIG. 7 generates and/or is a means for generating a flow of a fluid (e.g., an airflow) toward the second example metal foam heat exchanger 703. In the illustrated example of FIG. 7, the second fan 725 is in fluid communication with and/or adjacent the front surface 709 of the second metal foam heat exchanger 703 such that the flow of fluid generated by the second fan 725 is received by and/or at the front surface 709 of the second metal foam heat exchanger 703. When received at the front surface 709 of the second metal foam heat exchanger 703, the flow of fluid generated by the second fan 725 has a temperature that is relatively lower (e.g., cooler) than that of the porous metal foam structure of the second metal foam heat exchanger 703 because the second metal foam heat exchanger 703 holds heat transferred from the second heat generating component 721 via the second heat pipe 723. Accordingly, the temperature of the fluid increases as the fluid flows from the front surface 709 of the second metal foam heat exchanger 703 though the pores 719 defined by the relatively higher (e.g., warmer) temperature porous metal foam structure of the second metal foam heat exchanger 703. In other words, heat is transferred from the second metal foam heat exchanger 703 to the fluid. As such, when the fluid emerges and/or exits at the rear surface 711, the first side surface 713, the second side surface 715 and/or the top surface 717 of the second metal foam heat exchanger 703, it carries the transferred heat away from the wearable device 700.

In the illustrated example of FIG. 7, the example housing 726 houses, encases and/or generally encloses the first and second example metal foam heat exchangers 702, 703, the first and second example heat generating components 720, 721, the first and second example heat pipes 722, 723 and the first and second example fans 724, 725 of the example wearable device 700 of FIG. 7. The housing 726 has a form factor sized to be worn by a human. In the illustrated example of FIG. 7, the example housing 726 includes an example first exhaust port 732 aligned with the rear surface 710 of the first metal foam heat exchanger 702, an example second exhaust port 734 aligned with the second side surface 714 of the first metal foam heat exchanger 702, and an example third exhaust port (not shown) aligned with the top surface 716 of the first metal foam heat exchanger 702. Similarly, the example housing 726 includes an example fourth exhaust port 733 aligned with the rear surface 711 of the second metal foam heat exchanger 703, an example fifth exhaust port 735 aligned with the first side surface 713 of the second metal foam heat exchanger 703, and an example sixth exhaust port (not shown) aligned with the top surface 717 of the second metal foam heat exchanger 703. In some examples, one or more of the first exhaust port 732, the second exhaust port 734, the third exhaust port, the fourth exhaust port 733, the fifth exhaust port 735 and/or the sixth exhaust port direct(s) the flow of the fluid and/or the exhaust flow away from a body contact surface of the example wearable device 700. This directing away from the wearer increases comfort for the wearer by reducing (e.g., avoiding) blowing hot air on the body of the wearer. The example housing 726 of FIG. 7 further includes an example first intake port 738 to supply a fluid (e.g. to the first fan 724, and an example second intake port 739 to supply a fluid (e.g. air) to the second fan 725.

In the illustrated example of FIG. 7, the housing 726 does not include a linear duct (e.g., a metallic duct) between the first metal foam heat exchanger 702 and any of the first exhaust port 732, the second exhaust port 734 or the third exhaust port. Similarly, the housing 726 does not include a linear duct between the second metal foam heat exchanger 703 and any of the fourth exhaust port 733, the fifth exhaust port 735 or the sixth exhaust port. The absence of a linear duct reduces the amount of space within the housing 726 that is required for dispersing the flow of the fluid and/or the exhaust flow in multiple different directions relative to parallel plate heat exchangers. In some examples, the housing 726 may include a non-linear duct (e.g., a duct fabricated from sponge or foam material) between the first metal foam heat exchanger 702 and any of the first exhaust port 732, the second exhaust port 734 or the third exhaust port, and/or between the second metal foam heat exchanger 703 and any of the fourth exhaust port 733, the fifth exhaust port 735 or the sixth exhaust port. In such examples, the non-linear duct(s) prevent(s) the flow of the fluid exiting and/or emerging from the first metal foam heat exchanger 702 and/or the second metal foam heat exchanger 703 from recirculating back into the wearable device 700.

In some examples, the first exhaust port 732 of the housing 726 is in fluid communication with and/or adjacent the rear surface 710 of the first metal foam heat exchanger 702 such that a first portion of the flow of fluid passing through the pores 718 of the first metal foam heat exchanger 702 is received by and/or at the first exhaust port 732 as the first portion of the flow emerges and/or exits from the rear surface 710 of the first metal foam heat exchanger 702. In some examples, the second exhaust port 734 of the housing 726 is in fluid communication with and/or adjacent the second side surface 714 of the first metal foam heat exchanger 702 such that a second portion of the flow of fluid passing through the pores 718 of the first metal foam heat exchanger 702 is received by and/or at the second exhaust port 734 as the second portion of the flow emerges and/or exits from the second side surface 714 of the first metal foam heat exchanger 502. In some examples, the third exhaust port of the housing 726 is in fluid communication with and/or adjacent the top surface 716 of the first metal foam heat exchanger 702 such that a third portion of the flow of fluid passing through the pores 718 of the first metal foam heat exchanger 702 is received by and/or at the third exhaust port as the third portion of the flow emerges and/or exits from the top surface 716 of the first metal foam heat exchanger 702. In some examples, the fourth exhaust port 733 of the housing 726 is in fluid communication with and/or adjacent the rear surface 711 of the second metal foam heat exchanger 703 such that a first portion of the flow of fluid passing through the pores 719 of the second metal foam heat exchanger 703 is received by and/or at the fourth exhaust port 733 as the first portion of the flow emerges and/or exits from the rear surface 711 of the second metal foam heat exchanger 703. In some examples, the fifth exhaust port 735 of the housing 726 is in fluid communication with and/or adjacent the first side surface 713 of the second metal foam heat exchanger 703 such that a second portion of the flow of fluid passing through the pores 719 of the second metal foam heat exchanger 703 is received by and/or at the fifth exhaust port 735 as the second portion of the flow emerges and/or exits from the first side surface 713 of the second metal foam heat exchanger 703. In some examples, the sixth exhaust port of the housing 726 is in fluid communication with and/or adjacent the top surface 717 of the second metal foam heat exchanger 703 such that a third portion of the flow of fluid passing through the pores 719 of the second metal foam heat exchanger 703 is received by and/or at the sixth exhaust port as the third portion of the flow emerges and/or exits from the top surface 717 of the third metal foam heat exchanger 703.

By dispersing a respective exhaust flow in multiple directions by directing the fluid through multiple tortuous non-linear paths, each of the first and second example metal foam heat exchangers 702, 703 of the example wearable device 700 of FIG. 7 advantageously reduces the velocity at which the respective exhaust flow emerges from and/or exits the corresponding metal foam heat exchanger 702, 703 and/or the wearable device 700 of FIG. 7 relative to the velocity at which the respective exhaust flow would otherwise emerge from and/or exit the wearable device 700 of FIG. 7 if the wearable device 700 were to incorporate parallel plate heat exchangers e.g., the parallel plate heat exchanger 102 of FIG. 1) in place of the corresponding metal foam heat exchangers 702, 703.

While an example manner of implementing an example wearable device 700 having first and second example metal foam heat exchangers 702, 703 is illustrated in FIG. 7, one or more of the structures, components, elements and/or devices illustrated in FIG. 7 may be combined, divided, re-arranged, omitted, eliminated, duplicated and/or implemented in any other way.

Figure 8:
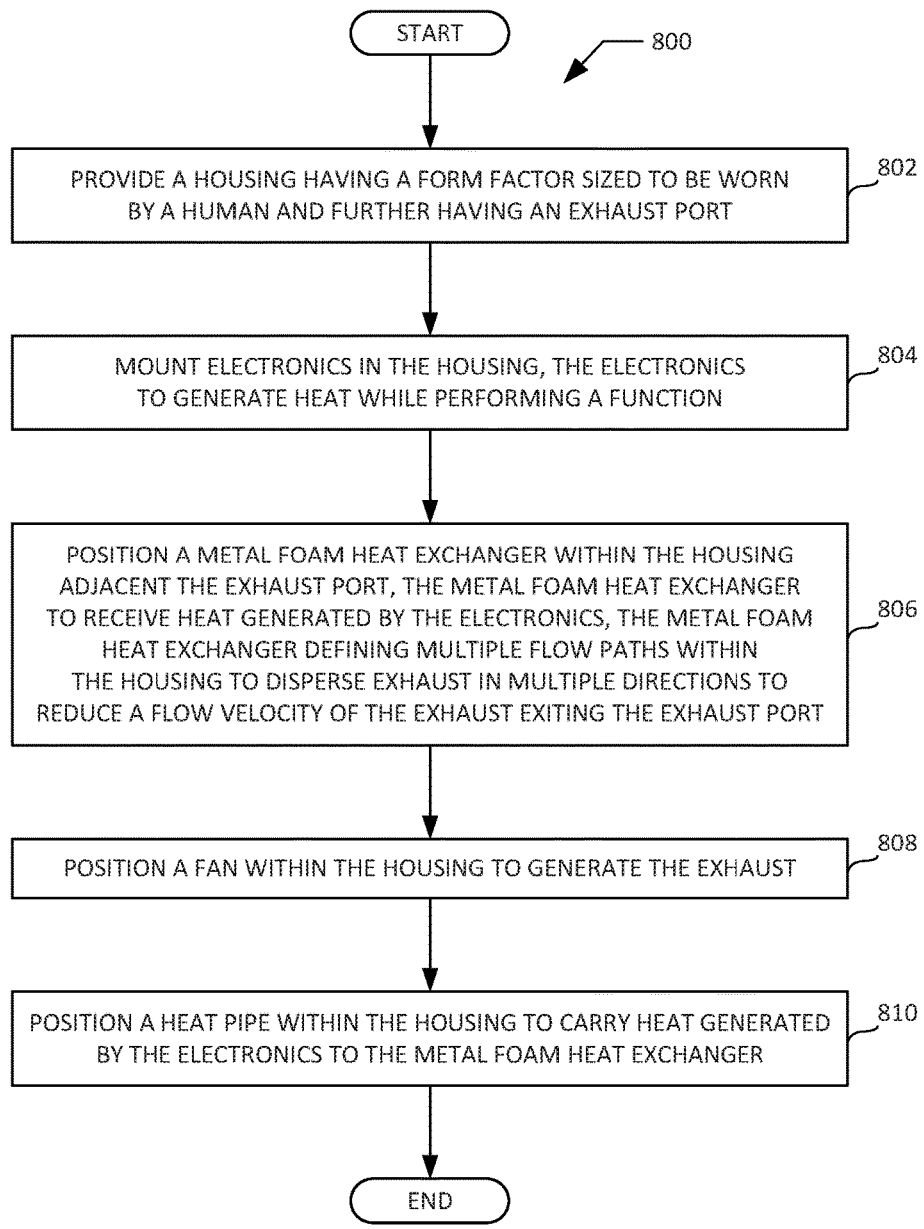
FIG. 8 is a flowchart representative of an example method of manufacturing the example electronic device of FIG. 4 and/or the example wearable device of FIG. 7.

FIG. 8 is a flowchart representative of an example method 800 of manufacturing a wearable device (e.g., the example electronic device 400 of FIGS. 4 and 5, or the example wearable device 700 of FIG. 7). The method 800 of FIG. 8 begins with providing a housing (e.g., the example housing 426 of FIG. 4, or the example housing 726 of FIG. 7) having a form factor sized to be worn by a human, and further having an exhaust port (e.g., the example first, second and third exhaust ports 432, 434, 436 of FIG. 4, or the example first exhaust port 732, the example second exhaust port 734, the example third exhaust port, the example fourth exhaust port 733, the example fifth exhaust port 735 and the example sixth exhaust port of FIG. 7) (block 802). In some examples, the wearable device of the method 800 of FIG. 8 is dimensioned to be worn as an article of clothing. In other examples, the wearable device of the method 800 of FIG. 8 is dimensioned to be worn as an accessory (e.g., a watch, a headset, etc.). In some examples, the exhaust port of the wearable device of the method 800 of FIG. 8 includes a first port on a first side of the housing and a second port on a second side of the housing. In some such examples, at least one of the first and second ports directs the exhaust away from a body contact surface of the wearer.

The method 800 of FIG. 8 includes mounting a heat generating component (e.g., the example heat generating component 420 of FIGS. 4 and 5, or the example first and/or second heat generating components 720, 721 of FIG. 7) within the housing (block 804). The heat generating component of the wearable device of the method 800 of FIG. 8 generates heat while performing a function.

The method 800 of FIG. 8 includes positioning a metal foam heat exchanger (e.g., the example metal foam heat exchanger 402 of FIGS. 4-6, or the first and/or second metal foam heat exchangers 702, 703 of FIG. 7) within the housing adjacent the exhaust port (block 806). The metal foam heat exchanger of the wearable device of the method 800 of FIG. 8 is to receive heat generated by the heat generating component. The metal foam heat exchanger of the wearable device of the method 800 of FIG. 8 defines multiple tortuous non-linear flow paths within the housing to disperse exhaust in multiple directions to reduce a flow velocity of the exhaust exiting the exhaust port. In some examples, the housing of the wearable device of the method 800 of FIG. 8 does not include a linear duct (e.g., a metallic duct) between the metal foam heat exchanger and the exhaust port. In some such examples, the absence of the linear duct reduces an amount of space within the housing required for dispersing exhaust in multiple directions. In some examples, the metal foam heat exchanger of the wearable device of the method 800 of FIG. 8 is to exhaust the exhaust at lower velocity than a parallel plate heat exchanger of a same size as a size of the metal foam heat exchanger.

The method 800 of FIG. 8 includes positioning a fan (e.g., the example fan 424 of FIGS. 4 and 5, or the example first and/or second fans 724, 725 of FIG. 7) within the housing to generate the exhaust (block 808). In some examples, the metal foam heat exchanger of the wearable device of the method 800 of FIG. 8 includes a first surface to receive a flow of a fluid from the fan. In some examples, the metal foam heat exchanger of the wearable device of the method 800 of FIG. 8 includes a second surface opposite the first surface and in fluid communication with the first surface via first fluid passageways and/or tortuous non-linear flow paths of the metal foam. In some examples, the second surface is to exhaust a first portion of the flow of the fluid received at the first surface in a first direction via the first fluid passageways. In some examples, the metal foam heat exchanger of the wearable device of the method 800 of FIG. 8 includes a third surface located between the first and second surfaces and in fluid communication with the first surface via second fluid passageways and/or tortuous non-linear flow paths of the metal foam. In some examples, the third surface is to exhaust a second portion of the flow of the fluid received at the first surface in a second direction via the second fluid passageways. In some examples, the second direction is different from the first direction. In some examples, at least one of the first and second directions is away from skin of the wearer. In some examples, the exhaust port of the wearable device of the method 800 of FIG. 8 includes a first port on a first side of the housing aligned with the second surface of the heat exchanger and a second port on a second side of the housing aligned with the third surface of the heat exchanger.

The method 800 of FIG. 8 includes positioning a heat pipe (e.g., the example heat pipe 422 of FIGS. 4 and 5, or the example first and/or second heat pipes 722, 723 of FIG. 7) within the housing (block 810). In some examples, the heat pipe of the wearable device of the method 800 of FIG. 8 has a first end to be coupled to the metal foam heat exchanger and a second end to be coupled to the heat generating component. Following block 810, the example method 800 of FIG. 8 ends.

Figure 9:
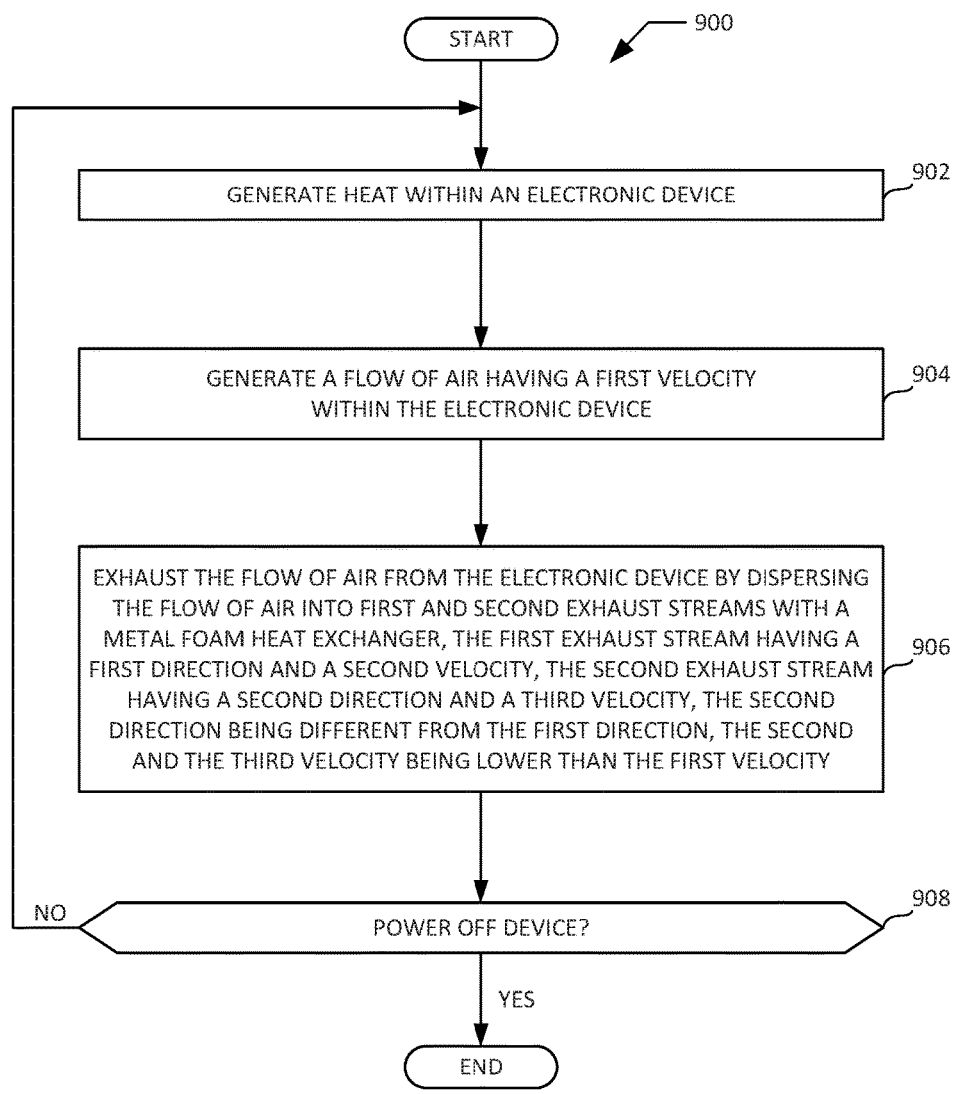
FIG. 9 is a flowchart representative of an example method of improving wearability of an electronic device.

FIG. 9 is a flowchart representative of an example method 900 of improving wearability of an electronic device the example electronic device 400 of FIGS. 4 and 5 or the example wearable device 700 of FIG. 7) some examples, the electronic device of the method 900 of FIG. 9 is dimensioned to be worn as an article of clothing or an accessory.

The method 900 of FIG. 9 begins with generating heat within the electronic device (block 902). For example, heat may be generated by a heat generating component (e.g., the example heat generating component 420 of FIGS. 4 and 5, or the example first and/or second heat generating components 720, 721) of the electronic device of the method 900 of FIG. 9 performing one or more operations.

The method 900 of FIG. 9 includes generating a flow of air having a first velocity within the electronic device (block 904). For example, a flow of air having a first velocity may be generated by a fan (e.g., the example fan 424 of FIGS. 4 and 5, or the example first and/or second fans 724, 725 of FIG. 7) of the electronic device of the method 900 of FIG. 9.

The method 900 of FIG. 9 includes exhausting the flow of air from the electronic device by dispersing the flow of air into first and second exhaust streams with a metal foam heat exchanger (e.g., the example metal foam heat exchanger 402 of FIGS. 4-6, or the example first and/or second metal foam heat exchangers 702, 703 of FIG. 7) (block 906).

The method 900 of FIG. 9 includes determining whether the electronic device is to be and/or has been powered off (block 908). If the electronic device is not to be and/or has not been powered off, control of the method 900 of FIG. 9 returns to block 902. If the electronic device is to be and/or has been powered off, the method 900 of FIG. 9 ends.

In some examples, the first exhaust stream of the electronic device of the method 900 of FIG. 9 has a first direction and a second velocity, and the second exhaust stream of the electronic device of the method 900 of FIG. 9 has a second direction and a third velocity. In some examples, the second direction is different from the first direction. In some examples, the second velocity and the third velocity are lower than the first velocity. In some examples, the metal foam heat exchanger of the electronic device of the method 900 of FIG. 9 is to receive the heat generated within the electronic device and to transfer the heat to the flow of air.

In some examples, the electronic device of the method 900 of FIG. 9 includes a housing (e.g., the example housing 426 of FIG. 4, or the example housing 726 of FIG. 7) having a form factor sized to be worn by a human, and further having an exhaust port (e.g., the example first, second and third exhaust ports 432, 434, 436 of FIG. 4, or the example first exhaust port 732, the example second exhaust port 734, the example third exhaust port, the example fourth exhaust port 733, the example fifth exhaust port 735 and the example sixth exhaust port of FIG. 7). In some examples, the metal foam heat exchanger of the method 900 of FIG. 9 is disposed within the housing adjacent the exhaust port such that the first and second exhaust streams exit the exhaust port. In some examples, the electronic device of the method 900 of FIG. 9 further includes electronics (e.g., the example heat generating component 420 of FIGS. 4 and 5, or the example first and/or second heat generating components 720, 721) carried within the housing. The electronics generate the heat while performing a function, and the metal foam heat exchanger receives the heat generated by the electronics. In some examples, the electronic device of the method 900 of FIG. 9 further includes a heat pipe (e.g., the example heat pipe 422 of FIGS. 4 and 5, or the example first and/or second heat pipes 722, 723 of FIG. 7). In some examples, the heat pipe has a first end coupled to the metal foam heat exchanger and a second end coupled to a heat generating component e.g., the example heat generating component 420 of FIGS. 4 and 5, or the example first and/or second heat generating components 720, 721) of the electronic device.

In some examples, the exhaust port of the electronic device of the method 900 of FIG. 9 includes a first port on a first side of the housing and a second port on a second side of the housing. In some examples, the first port is aligned with the first exhaust stream and the second port is aligned with the second exhaust stream. In some examples, at least one of the first and second ports directs at least one of the first and second exhaust streams away from a body contact surface of the electronic device. In some examples, the housing of the electronic device of the method 900 of FIG. 9 does not include a linear duct (e.g., a metallic duct) between the metal foam heat exchanger and the exhaust port. In some examples, the absence of the linear duct reduces an amount of space within the housing required for dispersing the flow of air into the first and second exhaust streams.

From the foregoing, it will be appreciated that apparatus, devices, articles of manufacture, systems and methods have been disclosed herein which include a metal foam heat exchanger to advantageously disperse an exhaust flow in multiple directions, thereby reducing the velocity at which the exhaust flow emerges from and/or exits the metal foam heat exchanger relative to the velocity at which the exhaust flow would emerge from and/or exit a parallel plate heat exchanger of relatively the same size and shape as the metal foam heat exchanger. From the foregoing, it will also be appreciated that such a reduced velocity exhaust flow is particularly advantageous for wearable devices incorporating such metal foam heat exchangers. For such wearable devices, the reduced velocity exhaust flow advantageously provides for an increased level and/or degree of user comfort relative to the level and/or degree of comfort experienced by the user when subjected to a high exhaust flow velocity produced by a parallel plate heat exchanger. In some disclosed examples, the metal foam heat exchanger achieves the aforementioned benefits and advantages while maintaining a volume and/or weight that is/are comparable to, and/or improved (e.g., reduced) relative to, the volume and/or weight of a conventional parallel plate heat exchanger having a unidirectional exhaust flow.

The following is a list of examples that may be constructed based on the teachings disclosed above. Additional and/or alternative examples are possible and contemplated. This list is not intended to be exhaustive.

Example 1 is a wearable device. The wearable device of Example 1 comprises a housing having a form factor sized to be worn by a human. The housing has an exhaust port. The wearable device of Example 1 further includes a heat generating device carried within the housing. The heat generating device is to generate heat in operation. The wearable device of Example 1 further includes a metal foam heat exchanger disposed within the housing adjacent the exhaust port. The metal foam heat exchanger is to receive heat generated by the heat generating devices. The metal foam heat exchanger defines multiple flow paths within the housing to disperse exhaust in multiple directions to reduce a flow velocity of the exhaust exiting the exhaust port.

Example 2 includes the subject matter of Example 1, wherein the exhaust port includes a first port on a first side of the housing and a second port on a second side of the housing.

Example 3 includes the subject matter of Example 2, wherein at least one of the first and second ports directs the exhaust away from a body contact surface of the wearable device.

Example 4 includes the subject matter of any of Examples 1-3, wherein the housing does not include a linear duct between the metal foam heat exchanger and the exhaust port.

Example 5 includes the subject matter of Example 4, wherein the absence of the linear duct reduces an amount of space within the housing required for dispersing exhaust relative to a parallel plate heat exchanger.

Example 6 includes the subject matter of any of Examples 1-5, wherein the metal foam heat exchanger is to exhaust the exhaust at lower velocity than a parallel plate heat exchanger of a same size as the metal foam heat exchanger.

Example 7 includes the subject matter of any of Examples 1-6, wherein the wearable device further includes a fan to generate the exhaust.

Example 8 includes the subject matter of Example 7, wherein the metal foam heat exchanger includes a first surface to receive a flow of a fluid from the fan.

Example 9 includes the subject matter of Example 8, wherein the metal foam heat exchanger includes a second surface opposite the first surface and in fluid communication with the first surface via at least a first one of the multiple flow paths. The second surface is to exhaust a first portion of the fluid received at the first surface in a first direction via the at least a first one of the multiple flow paths.

Example 10 includes the subject matter of Example 9, wherein the metal foam heat exchanger includes a third surface located between the first and second surfaces and in fluid communication with the first surface via at least a second one of the multiple flow paths. The third surface is to exhaust a second portion of the fluid received at the first surface in a second direction via the at least a second one of the multiple flow paths. The second direction is different from the first direction.

Example 11 includes the subject matter of Example 10, wherein at least one of the first and second directions is away from a body of a wearer of the wearable device.

Example 12 includes the subject matter of Example 10, wherein the exhaust port includes a first port on a first side of the housing aligned with the second surface of the metal foam heat exchanger and a second port on a second side of the housing aligned with the third surface of the metal foam heat exchanger.

Example 13 includes the subject matter of any of Examples 1-12, wherein the wearable device further includes a heat pipe having a first end coupled to the metal foam heat exchanger and a second end coupled to the heat generating device.

Example 14 includes the subject matter of any of Examples 1-13, wherein the wearable device is dimensioned to be worn as at least one of an article of clothing and an accessory.

Example 15 is an electronic device. The electronic device of Example 15 comprises means for generating a flow of a fluid. The electronic device of Example 15 further includes a metal foam heat exchanger in fluid communication with the means for generating. The metal foam heat exchanger includes an intake to receive the flow of the fluid from the means for generating. The metal foam heat exchanger further includes a first exhaust means for exhausting a first portion of the flow of the fluid in a first direction. The first exhaust means is in fluid communication with the intake. The metal foam heat exchanger further includes a second exhaust means for exhausting a second portion of the flow of the fluid in a second direction different from the first direction. The second exhaust means is in fluid communication with the intake.

Example 16 includes the subject matter of Example 15, wherein the electronic device further includes a housing having a form factor sized to be worn by a human. The housing has an exhaust port. The metal foam heat exchanger is disposed within the housing adjacent the exhaust port. The first and second exhaust means are to reduce a velocity of the flow of the fluid exiting the exhaust port. The electronic device of Example 16 further includes electronics carried within the housing. The electronics are to generate heat when operating. The metal foam heat exchanger is to receive the heat generated by the electronics.

Example 17 includes the subject matter of Example 16, wherein the exhaust port includes a first port on a first side of the housing and a second port on a second side of the housing.

Example 18 includes the subject matter of Example 17, wherein the first port is aligned with the first exhaust means and the second port is aligned with the second exhaust means.

Example 19 includes the subject matter of any of Examples 17 and 18, wherein at least one of the first and second ports directs the flow of the fluid away from a body of a wearer of the electronic device.

Example 20 includes the subject matter of any of Examples 16-19, wherein the housing does not include a linear duct between the metal foam heat exchanger and the exhaust port to reduce an amount of space within the housing required for dispersing the flow of the fluid in the first and second directions relative to a parallel plate heat exchanger.

Example 21 includes the subject matter of any of Examples 16-20, wherein the metal foam heat exchanger is to exhaust the flow of the fluid at a lower velocity than a parallel plate heat exchanger of a same size as the metal foam heat exchanger.

Example 22 includes the subject matter of any of Examples 16-21, wherein the electronic device further includes a heat pipe having a first end coupled to the metal foam heat exchanger and a second end coupled to a heat generating device.

Example 23 is a method of manufacturing a wearable device. The method of Example 23 comprises providing a housing having a form factor sized to be worn by a human. The housing has an exhaust port. The method of Example 23 includes mounting electronics within the housing. The electronics are to generate heat in operation. The method of Example 23 includes positioning a metal foam heat exchanger within the housing adjacent the exhaust port. The metal foam heat exchanger is to receive heat generated by the electronics. The metal foam heat exchanger defines tortuous flow paths within the housing to disperse exhaust in multiple directions to reduce a flow velocity of the exhaust exiting the exhaust port.

Example 24 includes the subject matter of Example 23, wherein the exhaust port includes a first port on a first side of the housing and a second port on a second side of the housing.

Example 25 includes the subject matter of Example 24, wherein at least one of the first and second ports directs the exhaust away from a body contact surface of the wearable device.

Example 26 includes the subject matter of any of Examples 23-25, wherein the housing does not include a linear duct between the metal foam heat exchanger and the exhaust port.

Example 27 includes the subject matter of Example 26, wherein the absence of the linear duct reduces an amount of space within the housing required for dispersing exhaust relative to a parallel plate heat exchanger.

Example 28 includes the subject matter of any of Examples 23-27, wherein the metal foam heat exchanger is to exhaust the exhaust at lower city than a parallel plate heat exchanger of a same size as the metal foam heat exchanger.

Example 29 includes the subject matter of any of Examples 23-28, wherein the method further includes positioning a fan within the housing to generate the exhaust.

Example 30 includes the subject matter of Example 29, wherein the metal foam heat exchanger includes a first surface to receive a flow of a fluid from the fan.

Example 31 includes the subject matter of Example 30, wherein the metal foam heat exchanger includes a second surface opposite the first surface and in fluid communication with the first surface via at least a first one of the tortuous flow paths. The second surface is to exhaust a first portion of the fluid received at the first surface in a first direction via the at least a first one of the tortuous flow paths.

Example 32 includes the subject matter of Example 31, wherein the metal foam heat exchanger includes a third surface located between the first and second surfaces and in fluid communication with the first surface via at least a second one of the tortuous flow paths of the metal foam. The third surface to exhaust a second portion of the fluid received at the first surface in a second direction via the at least a second one of the tortuous flow paths. The second direction is different from the first direction.

Example 33 includes the subject matter of Example 32, wherein at least one of the first and second directions is away from a body of a wearer of the wearable device.

Example 34 includes the subject matter of Example 32, wherein the exhaust port includes a first port on a first side of the housing aligned with the second surface of the metal foam heat exchanger and a second port on a second side of the housing aligned with the third surface of the metal foam heat exchanger.

Example 35 includes the subject matter of any of Examples 23-34, wherein the method further includes positioning a heat pipe within the housing. The heat pipe has a first end to be coupled to the metal foam heat exchanger and a second end to be coupled to a heat generating component of the electronics.

Example 36 includes the subject matter of any of Examples 23-35, wherein the wearable device is dimensioned to be worn as at least one of an article of clothing and an accessory.

Example 37 is a method of improving wearability of an electronic device. The method of Example 37 comprises generating a flow of air having a first velocity within the electronic device. The method of Example 37 further includes exhausting the flow of air from the electronic device by dispersing the flow of air into first and second exhaust streams with a metal foam heat exchanger. The first exhaust stream has a first direction and a second velocity. The second exhaust stream has a second direction and a third velocity. The second direction is different from the first direction. The second velocity and the third velocity are lower than the first velocity. The metal foam heat exchanger is to receive heat generated within the electronic device and transfer the heat to the flow of air.

Example 38 includes the subject matter of Example 37, wherein the electronic device includes a housing having a form factor sized to be worn by a human. The housing has an exhaust port. The metal foam heat exchanger is disposed within the housing adjacent the exhaust port. The first and second exhaust streams exit the exhaust port. The electronic device further includes electronics carried within the housing. The electronics are to generate the heat when operating. The metal foam heat exchanger to receive the heat generated by the electronics.

Example 39 includes the subject matter of Example 38, wherein the exhaust port includes a first port on a first side of the housing and a second port on a second side of the housing.

Example 40 includes the subject matter of Example 39, wherein the first port is aligned with the first exhaust stream and the second port is aligned with the second exhaust stream.

Example 41 includes the subject matter of any of Examples 39 and 40, wherein at least one of the first and second ports directs at least one of the first and second exhaust streams away from a body of a wearer of the electronic device.

Example 42 includes the subject matter of any of Examples 38-41, wherein the housing does not include a linear duct between the metal foam heat exchanger and the exhaust port to reduce an amount of space within the housing required for dispersing the flow of air into the first and second exhaust streams.

Example 43 includes the subject matter of any of Examples 38-42, wherein the electronic device further includes a heat pipe having a first end coupled to the metal foam heat exchanger and a second end coupled to a heat generating device.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A wearable device comprising:
   a housing to be worn by a human, the housing having a first exhaust port on a first side of the housing and a second exhaust port on a second side of the housing different from the first side;
   a heat generating device carried within the housing, the heat generating device to generate heat;
   a fan carried within the housing, the fan to generate a flow of fluid away from the fan in a first direction; and
   a metal foam heat exchanger disposed within the housing adjacent the first exhaust port and the second exhaust port, the metal foam heat exchanger to receive heat generated by the heat generating device and to receive the flow of fluid generated in the first direction by the fan, the metal foam heat exchanger defining multiple flow paths within the housing to disperse the flow of fluid in multiple directions to reduce a flow velocity of the flow of fluid exiting the first exhaust port and the second exhaust port, the multiple directions including a second direction toward the first exhaust port and a third direction toward the second exhaust port.

2. A wearable device as defined in claim 1, wherein at least one of the first and second exhaust ports directs the flow of fluid away from a body contact surface of the wearable device.

3. A wearable device as defined in claim 1, wherein the housing does not include a linear duct between the metal foam heat exchanger and either of the first and second exhaust ports.

4. A wearable device as defined in claim 3, wherein the absence of the linear duct reduces an amount of space within the housing required for dispersing the flow of fluid relative to a parallel plate heat exchanger.

5. A wearable device as defined in claim 1, wherein the metal foam heat exchanger is to disperse the flow of fluid to cause the flow of fluid to exit the first exhaust port at lower velocity than a parallel plate heat exchanger of a same size as the metal foam heat exchanger.

6. A wearable device as defined in claim 1, wherein the metal foam heat exchanger includes a first surface to receive the flow of fluid from the fan.

7. A wearable device as defined in claim 6, wherein the metal foam heat exchanger includes a second surface opposite the first surface and in fluid communication with the first surface via at least a first one of the multiple flow paths, the second surface to exhaust a first portion of the fluid received at the first surface in the second direction via the at least the first one of the multiple flow paths.

8. A wearable device as defined in claim 7, wherein the metal foam heat exchanger includes a third surface extending between the first and second surfaces and in fluid communication with the first surface via at least a second one of the multiple flow paths, the third surface to exhaust a second portion of the fluid received at the first surface in the third direction via the at least the second one of the multiple flow paths, the third direction being different from the second direction.

9. A wearable device as defined in claim 8, wherein at least one of the second and third directions is away from a body of a wearer of the wearable device.

10. A wearable device as defined in claim 8, wherein the first exhaust port is aligned with the second surface of the metal foam heat exchanger and the second exhaust port is aligned with the third surface of the metal foam heat exchanger.

11. A wearable device as defined in claim 1, further including a heat pipe having a first end coupled to the metal foam heat exchanger and a second end coupled to the heat generating device.

12. A wearable device as defined in claim 1, wherein the wearable device is dimensioned to be worn as at least one of an article of clothing and an accessory.

13. A method of manufacturing a wearable device, the method comprising:
   providing a housing to be worn by a human, the housing having a first exhaust port on a first side of the housing and a second exhaust port on a second side of the housing different from the first side;
   mounting electronics within the housing, the electronics to generate heat;
   positioning a fan to generate a flow of fluid away from the fan in a first direction within the housing; and
   positioning a metal foam heat exchanger within the housing adjacent the first exhaust port and the second exhaust port, the metal foam heat exchanger to receive heat generated by the electronics and to receive the flow of fluid generated in the first direction by the fan, the metal foam heat exchanger defining tortuous flow paths within the housing to disperse the flow of fluid in multiple directions to reduce a flow velocity of the flow of fluid exiting the first exhaust port and the second exhaust port, the multiple directions including a second direction toward the first exhaust port and a third direction toward the second exhaust port.

14. A method as defined in claim 13, wherein at least one of the first and second exhaust ports directs the flow of fluid away from a body contact surface of the wearable device.

15. A method of improving wearability of an electronic device, the method comprising:
   generating, via a fan carried within a housing of the electronic device, a flow of air away from the fan in a first direction within the housing, the flow of air having a first velocity, the housing to be worn by an animal, the housing having a first exhaust port on a first side of the housing and a second exhaust port on a second side of the housing different from the first side; and
   exhausting the flow of air from the housing of the electronic device by dispersing the flow of air into first and second exhaust streams with a metal foam heat exchanger disposed within the housing adjacent the first exhaust port and the second exhaust port, the metal foam heat exchanger positioned to receive the flow of air from the first direction, the first exhaust stream flowing in a second direction toward the first exhaust port and having a second velocity, the second exhaust stream flowing in a third direction toward the second exhaust port and having a third velocity, the third direction being different from the second direction, the second velocity and the third velocity being lower than the first velocity, the metal foam heat exchanger to receive heat generated by electronics carried within the housing of the electronic device and to transfer the heat to the flow of air.

16. A wearable device as defined in claim 1, wherein the metal foam heat exchanger has a cuboidal shape.

17. A wearable device as defined in claim 8, wherein the metal foam heat exchanger includes a fourth surface extending between the first and second surfaces and in fluid communication with the first surface via at least a third one of the multiple flow paths, the fourth surface to exhaust a third portion of the fluid received at the first surface in a fourth direction via the at least the third one of the multiple flow paths, the fourth direction being different from the second direction and different from the third direction, the fourth direction being toward a third exhaust port of the housing, the third exhaust port being on a third side of the housing different from the first side and different from the second side.

18. A wearable device as defined in claim 17, wherein the third exhaust port is aligned with the fourth surface of the metal foam heat exchanger.

19. A method as defined in claim 13, wherein the positioning of the metal foam heat exchanger within the housing includes:
   positioning a first surface of the metal foam heat exchanger toward the fan, the first surface to receive the flow of fluid from the fan;
   positioning a second surface of the metal foam heat exchanger in alignment with the first exhaust port, the second surface being opposite the first surface and in fluid communication with the first surface via at least a first one of the tortuous flow paths, the second surface to exhaust a first portion of the fluid received at the first surface in the second direction via the at least the first one of the tortuous flow paths, the second direction being toward the first exhaust port; and
   positioning a third surface of the metal foam heat exchanger in alignment with the second exhaust port, the third surface extending between the first and second surfaces and in fluid communication with the first surface via at least a second one of the tortuous flow paths, the third surface to exhaust a second portion of the fluid received at the first surface in the third direction via the at least the second one of the tortuous flow paths, the third direction being toward the second exhaust port.

20. A method as defined in claim 19, wherein the positioning of the metal foam heat exchanger within the housing further includes positioning a fourth surface of the metal foam heat exchanger adjacent a third exhaust port of the housing, the fourth surface extending between the first and second surfaces and in fluid communication with the first surface via at least a third one of the tortuous flow paths, the fourth surface to exhaust a third portion of the fluid received at the first surface in the fourth direction via the at least the third one of the tortuous flow paths, the fourth direction being toward the third exhaust port, the third exhaust port being on a third side of the housing different from the first side and different from the second side.

21. A method as defined in claim 15, wherein the exhausting of the flow of air from the housing of the electronic device includes:
   receiving the flow of air from the fan at a first surface of the metal foam heat exchanger, the metal foam heat exchanger defining multiple flow paths;
   exhausting a first portion of the flow of air received at the first surface from a second surface of the metal foam heat exchanger, the second surface being opposite the first surface and in fluid communication with the first surface via at least a first one of the multiple flow paths, the first exhaust stream passing from the second surface of the metal foam heat exchanger through the first exhaust port of the housing; and
   exhausting a second portion of the flow of air received at the first surface from a third surface of the metal foam heat exchanger, the third surface extending between the first and second surfaces and in fluid communication with the first surface via at least a second one of the multiple flow paths, the second exhaust stream passing from the third surface of the metal foam heat exchanger through the second exhaust port of the housing.

22. A method as defined in claim 21, wherein the exhausting of the flow of air from the housing of the electronic device further includes exhausting a third portion of the flow of air received at the first surface from a fourth surface of the metal foam heat exchanger, the fourth surface extending between the first and second surfaces and in fluid communication with the first surface via at least a third one of the multiple flow paths, the third portion being exhausted in a fourth direction from the housing via a third exhaust stream, the fourth direction being different from the second direction and different from the third direction, the third exhaust stream passing from the fourth surface of the metal foam heat exchanger through a third exhaust port of the housing, the third exhaust port being on a third side of the housing different from the first side and different from the second side.

* * * * *